United States Patent [19]

Krein

[11] Patent Number: 5,734,552
[45] Date of Patent: Mar. 31, 1998

[54] AIRFOIL DEFLECTOR FOR COOLING COMPONENTS

[75] Inventor: Paul C. Krein, Rochester, N.Y.

[73] Assignee: Sun Microsystems, Inc., Mountain View, Calif.

[21] Appl. No.: 667,420

[22] Filed: Jun. 21, 1996

[51] Int. Cl.$^6$ .................................................. H05K 7/20
[52] U.S. Cl. .............. 361/695; 165/80.3; 165/DIG. 529; 257/707; 257/713; 257/721; 361/704
[58] Field of Search .................. 165/80.2, 80.3, 165/185, DIG. 529, 81; 174/16.3; 257/706, 707, 712, 713, 721–722; 361/688, 689, 690, 694, 695, 697, 704, 709, 710, 717, 718, 722; 415/178, 191, 208.2

[56] References Cited

U.S. PATENT DOCUMENTS

| | | | |
|---|---|---|---|
| 2,834,582 | 5/1958 | Kablitz | 165/81 |
| 4,616,693 | 10/1986 | Dietzsch et al. | 165/80.3 |
| 5,221,181 | 6/1993 | Ferleger et al. | 415/191 |
| 5,292,230 | 3/1994 | Brown | 415/191 |
| 5,597,035 | 1/1997 | Smith et al. | 361/697 |

*Primary Examiner*—Gregory D. Thompson
*Attorney, Agent, or Firm*—Julian Caplan; Flehr Hohbach Test Albritton & Herbert

[57] ABSTRACT

A deflector shaped in cross-section like an airfoil directs a stream of fluid such as air from a source such as a fan towards a heat-generating component such as a chip to improve cooling of the component. The foil is invented as compared with an airplane wing to produce an inverse "lift" at reduced temperature to cool a heat sink thermally connected to a heat-producing component. The airfoil effect also moves air away from the component at increased velocity to cool it more rapidly. In confined areas multiple deflectors may be arranged in the manner of sails of a boat for augmented cooling.

6 Claims, 1 Drawing Sheet

AIRFOIL DEFLECTOR FOR COOLING COMPONENTS

BACKGROUND OF THE INVENTION

1. Field of the Invention

This invention relates to new and improved airfoil deflector for cooling electronic components. Typically the invention may be used in a confined space to better cool a heat emitting component by cooling and directing a stream of air from a source such as a fan downwardly toward the component or a heat sink attached to the component.

2. Description of the Prior Art

The use of airstreams created by fans or other means to cool electronic components has become increasingly common. However, the present invention differs from prior cooling systems in that the air from a source encounters an inverted airfoil so that an inverse "lift" more effectively directs cooled air downwardly toward the component or to a heat sink which is thermally connected to the component.

SUMMARY OF THE INVENTION

A component such as a chip which emits heat is located in a confined space and must be cooled in order to prevent deterioration of the component. A fan or other fluid-moving device directs an airstream against an inverted airfoil (i.e., one in which the curved surface is lowermost) so that the air is cooled and also directed downwardly in what may be termed an inverse lift toward the component. It will be understood that fluids other than air may be used such as, for example, other gases or liquid such as water.

Further, in order to augment the airfoil effect, several airfoils may be arranged in a pattern. Such pattern may resemble multiple sails of a sailboat.

Inverse lift is caused by a low-pressure zone being created on the lower or curved surface of a deflector where the air is traveling faster than the air on the opposite or straight surface of the deflector. Thus the pressure on the underside drops, creating an inverse lift. Using the formula PV=nRT, if P(pressure) drops, then T(temperature) drops correspondingly. Thus the difference in pressure results in a difference of temperature and thus reduces the temperature on the heat sink or on the chip itself. By coupling the heat sink to the chip in various ways a thermocouple results and the airflow dissipates heat via normal heat/airflow methods. The pressure change or lift effect is similar to that of a curved sail or a curved airplane wing.

The lift effect may be used to create artificial winds the same as a high and low pressure system in the atmosphere which aids in removing heat from the surface as well as creating additional cooling to the surfaces and surrounding chips. The effect also may be used to lift or move heat away from the chip more rapidly, thus more effectively cooling the chip.

Although illustrated herein as curving down, the shape may be used with other forces and effects when the design constraints on spacing, box size, airflow and adhesion/contact to the chip require.

In tight spaces, multiple deflectors may be stacked or layered similar to sails working together on a sailboat. The respective effects may be additive not only from a surface area but when placed together one shape directs or tunes the flow of air to the next surface. Accordingly additional cooling in a small area is made possible.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE PREFERRED EMBODIMENTS

Figure 1:
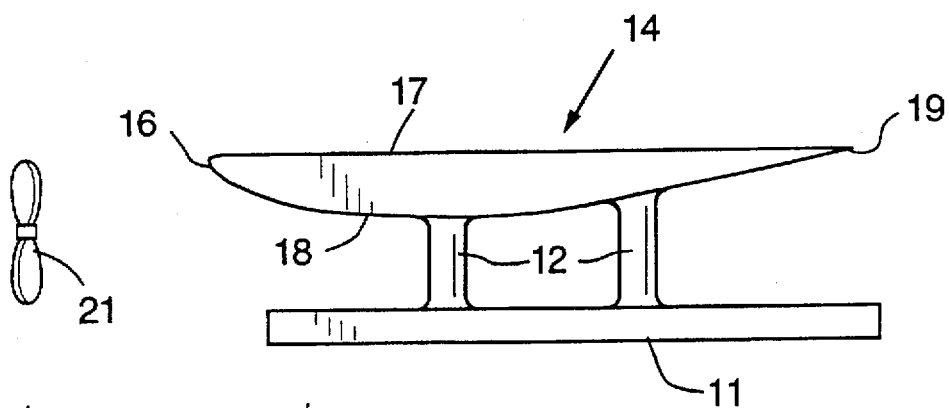
FIG. 1 is a side elevational view of one modification of the invention.

Reference will now be made in detail to the preferred embodiments of the invention, examples of which are illustrated in the accompanying drawings. While the invention will be described in conjunction with the preferred embodiments, it will be understood that they are not intended to limit the invention to those embodiments. On the contrary, the invention is intended to cover alternatives, modifications and equivalents, which may be included within the spirit and scope of the invention as defined by the appended claims.

An electrical component such as a chip 11 is located in a confined space. The component 11 emits heat which must be dissipated in order to prevent deterioration of the performance of the chip. Various heat sinks have been used to cool chips 11 and as shown in the accompanying drawings, 12 represents a heat sink or heat transfer means which is thermally connected to the chip 11 at one end and to the deflector 14 at the other.

Deflector 14 has the cross-section of an airfoil except that it is inverted. Thus leading edge 16 where the air contacts the deflector merges into a flat top surface 17 and a curved bottom surface 18, the surfaces 17 and 18 merging together at trailing edge 19. As shown herein a fan 21 directs air flow against the deflector 14. Another means may be substituted for fan 21, such as a pump for a fluid such as a liquid.

As stated in Bernoulli's Theorem, a low pressure is created on the surface 18 by reason of the fact that the velocity of air travel thereover is greater than on the surface 17. In an airplane this creates a lift. In the deflector 14 as mounted in the position shown in FIG. 1, there is an inverse lift. According to the formula PV=nRT, the drop in pressure creates a temperature drop, and the greater the difference in pressure the greater the lowering of the temperature. Accordingly the deflector 14 imposes a lower pressure downward forcing a drop in temperature. Since the heat sink 12 is directly connected to the chip 11, there is a thermocouple which permits the air to remove heat by normal heat/airflow methods.

As shown in FIG. 1, the deflector 14 is an inverted airfoil. However, it will be understood that a curved surface such as the cross-section of the sail of a boat creates the same effect. Accordingly fan 21 blows air against the airfoil and cools the chip 11 not only by reducing the temperature but also by more effectively moving the air away from the chip more rapidly because of the curved surface 18.

Figure 2:
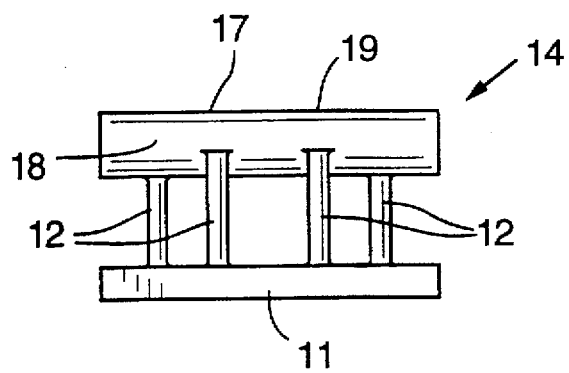
FIG. 2 is an end elevational view from the right of FIG. 1.
Figure 3:
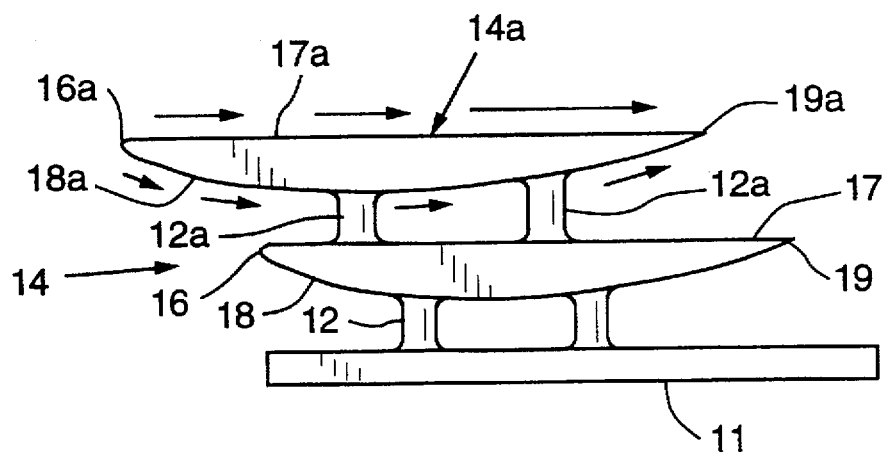
FIG. 3 is a view similar to FIG. 1 showing multiple deflectors.

Directing attention to FIG. 3, a second deflector 14a is mounted above deflector 14 and connected to the top surface thereof by additional heat transfer members 12a. This creates an even greater heat sink effect, more rapidly drawing heat away from chip 11a. In other respects, the structure of FIG. 3 resembles that of FIGS. 1–2 and the same reference numerals followed by subscript a are used to designate corresponding parts.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. In combination, a heat-emitting component, an inverted airfoil spaced opposite component, at least one heat sink thermally interconnecting said component and said airfoil, and means for creating a substantially unidirectional fluid flow, said airfoil having a leading edge and trailing edge, a first surface remote from said component and a second convex surface opposite said component, said means for creating a substantially unidirectional fluid flow forcing fluid toward said leading edge and over said second convex surface and between said airfoil and said component to create an inverse life in said fluid flow to cool and direct fluid away from said component.

2. A system according to claim 1 in which said means for creating a substantially unidirectional fluid flow comprises a fan.

3. A system according to claim 1 in which said component is a electrical component.

4. A system according to claim 1 in which said component is a chip.

5. A combination according to claim 1 which further comprises a second inverted airfoil similar to said first named air-foil on the side of said first-named airfoil opposite said component, said second inverted airfoil having a second convex surface facing said first-named deflector.

6. A system according to claim 5 which further comprises a heat sink affixed to said first-named and said second airfoils.

\* \* \* \* \*